United States Patent [19]
Madan

[11] Patent Number: 5,828,597
[45] Date of Patent: Oct. 27, 1998

[54] LOW VOLTAGE, LOW POWER STATIC RANDOM ACCESS MEMORY CELL

[75] Inventor: Sudhir K. Madan, Richardson, Tex.

[73] Assignee: Texas Instruments Incorporated, Dallas, Tex.

[21] Appl. No.: 831,811

[22] Filed: Apr. 2, 1997

[51] Int. Cl.⁶ .................................................. G11C 7/00
[52] U.S. Cl. ..................... 365/156; 365/174; 365/230.05
[58] Field of Search .................................... 365/154, 156, 365/174, 230.05

[56] References Cited

U.S. PATENT DOCUMENTS 5,353,251  10/1994  Uratani et al. ........................... 365/154
5,469,380  11/1995  Iio ........................................... 365/154
5,475,638  12/1995  Anami et al. ............................ 365/154

*Primary Examiner*—Vu A. Le
*Attorney, Agent, or Firm*—Jacqueline J. Garner; W. James Brady, III; Richard L. Donaldson

[57] ABSTRACT

A ten transistor low voltage, low power static random access memory cell (10) includes a first inverter (12) cross-coupled to a second inverter (18). A series combination of a first pass transistor (24) and a first bitline select transistor (28) is connected between an output node (13) of the first inverter (12) and a first bitline (36). A first write pass transistor (32) is placed in parallel with the first pass transistor (24). A series combination of a second pass transistor (26) and a second bitline select transistor (30) is connected between an output node (17) of the second inverter (18) and a second bitline (38). A second write pass transistor (34) is placed in parallel with the second pass transistor (26).

27 Claims, 2 Drawing Sheets

5,828,597

LOW VOLTAGE, LOW POWER STATIC RANDOM ACCESS MEMORY CELL

TECHNICAL FIELD OF THE INVENTION

The present invention relates in general to semiconductor memory devices and more particularly to a low voltage, low power static random access memory cell.

BACKGROUND OF THE INVENTION

Schematics of two typical static random access memory (SRAM) are shown in FIGS. 1A and 1B. The cell in FIG. 1A is called a six transistor (6 T) SRAM cell and comprises a pair of cross-coupled inverters to store a data bit state and pair of pass transistors to read and write a data bit between the cross-coupled inverters and a pair of bitlines. The bus which connects the pass transistor gates is called a wordline. To access a particular cell in an array, for reading or writing, the wordline connected to its pass transistor gates is activated to turn on the pass transistors.

The cell in FIG. 1B is an eight transistor (8 T) SRAM cell and comprises a pair of cross-coupled inverters to store a data bit state and a pair of two transistors in series between the output nodes of the cross-coupled inverters and a pair of bitlines. The two transistors in series between the output of an inverter and a bitline are also called an X-pass transistor and a Y-pass transistor. The X-pass transistors have their gates connected to a row select bus running in the X-direction called an X-address drive and the Y-pass transistors have their gates connected to a column select bus called a Y-address drive running in the Y-direction. To access a cell in an array, for reading or writing, both X-address and Y-address drives must be turned ON.

DC characteristics of a static random access memory (SRAM) cell are determined by three parameters—read current, bitline write voltage (i.e. trip voltage), and static noise margin. The static noise margin reflects upon the cell stability against noise in the circuit during a read operation. A relatively high noise margin is a desired feature of a static random access memory cell. However, for low voltage/ power devices with a supply voltage of typically 1 volt or below, obtaining a good static noise margin is difficult because the threshold voltages of the transistors within a cell are kept low to maintain a certain level of drive current for the transistors.

The static noise margin can be increased by increasing the beta ratio of a cell. The beta ratio for a 6 T cell is defined as the ratio of the drive currents for the driver (pull-down) transistor to that for the pass transistor when they have the same threshold voltage. For the 8 T cell, the beta ratio is defined as the ratio of the drive current for the driver transistor to that for the series of combination of the X-pass and Y-pass transistors. For the 6 T cell, the beta ratio is also the same as the width ratio of the driver and the pass transistors if they have the same gate length and threshold voltage.

A disadvantage of a high beta ratio is that it is difficult to write into a cell because an increase in the beta ratio lowers the bitline write voltage for the cell. This problem becomes more severe as the supply voltage Vcc is reduced for low voltage and or low power applications. Typically, a voltage below 1.5 V is considered a low voltage implementation. Therefore, it is desirable to increase the beta ratio of the memory cell without adversely affecting its write capability.

SUMMARY OF THE INVENTION

From the foregoing, it may be appreciated that a need has arisen for a memory cell with an increased static noise margin without adversely affecting its write capability. In accordance with the present invention, a low voltage, low power SRAM cell is provided that substantially eliminates or reduces disadvantages and problems associated with conventional SRAM cell designs.

According to an embodiment of the present invention, there is provided a ten transistor (10 T) low voltage, low power static random access memory cell that includes a first inverter having a first pull-up transistor connected between a first inverter output node and a Vcc or supply node, and a first pull-down transistor connected between the first inverter output node and a Vss or ground node. A typical transistor has at least three terminals—a source, a drain, and a gate. When it is said that a transistor is connected between two nodes, it means the transistor source is connected to one of the nodes and the transistor drain is connected to the other node. The cell also has a first pass transistor connected between the output node of the first inverter and a first pass node. A first bitline select transistor is connected between the first pass node and a first bitline. A first write pass transistor is also connected in parallel to the first pass transistor between the first pass node and the output node of the first inverter.

The cell also includes a second inverter having a second pull-up transistor connected between a second inverter output node and the Vcc, and a second pull-down transistor connected between the second inverter output node and the Vss. A second pass transistor is connected between the second inverter output node and a second pass node. A second bitline select transistor is connected between the second pass node and a second bitline also called bitline bar. A second write pass transistor is also connected in parallel with the second pass transistor between the second pass node and the second inverter output node. The first and second inverters are cross-coupled by connecting the output of the first inverter with the input of the second inverter and connecting the output of the second inverter with the input of the first inverter. To access the cell, the bitline select transistors are turned ON. During the read operation only the pass transistors are turned ON and the write pass transistors are kept OFF, whereas during the write operation the pass and write pass transistors are turned ON.

The present invention provides various technical advantages over conventional static random access memory cell devices. For example, one technical advantage is the use of an extra write pass transistor to alter the DC characteristics of the SRAM. By selecting a narrower width for the pass transistor and keeping the write pass transistor OFF during read, a high beta ratio is achieved to provide an increase in the static noise margin for the cell. By designing a wider write pass transistor width and turning ON both the pass and write pass transistors during write, the beta ratio of the cell is significantly reduced during the write operation, hence making it easier to write into the cell. If the write pass transistor width is significantly larger than that for the pass transistor, the pass transistor need not be turned ON during the write operation. Thus, the pass transistor can be used for the read operation and the write pass transistor can be used for the write operation.

Unlike a 6 T SRAM array where turning ON a wordline activates all the cells on that wordline, in the 10 T cell only the addressed cell is activated, thereby reducing the power loss associated with accessing a cell. Activating a cell causes current to flow from the bitline to the Vss through the cell. Reducing the number of activated cells will reduce the power for the memory. Typically, in a 10 T cell inside an array, the gates for the bitline select transistors are connected to the Y-address drive and the gates for the pass transistors and the write pass transistors obtain their signal from the X-address signal. The current in a cell only flows when 1) the bitline select transistors are turned ON and 2) pass transistors and or write pass transistors are turned ON. Since this can happen for the addressed cell only at any time, the power loss is reduced. In the above discussion for a 10 T cell array, we assume that the data consists of a single bit only. However, for the case where the data consists of say n bits per address, then typically, n cells will be activated for any address during a read or write operation. Other examples are readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1A:
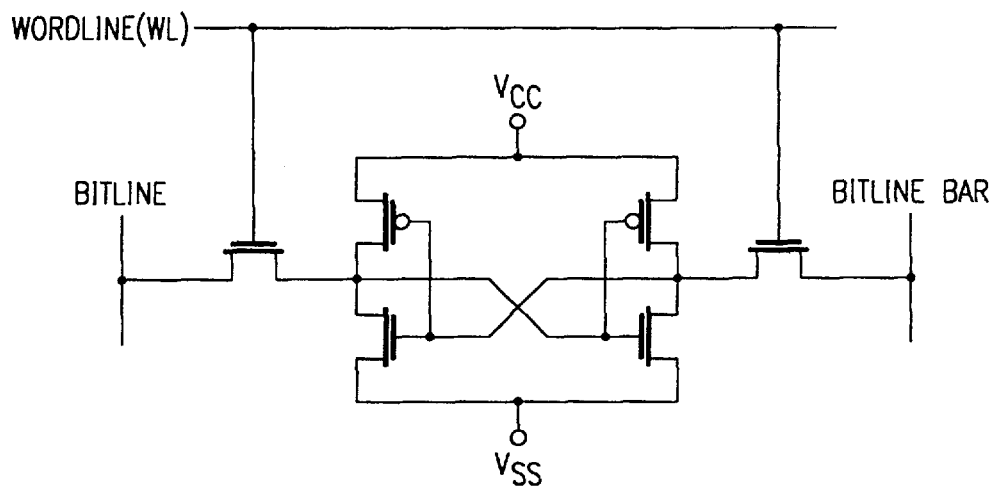
FIG. 1A illustrates a simplified schematic diagram of a six transistor static random access memory cell.
Figure 1B:
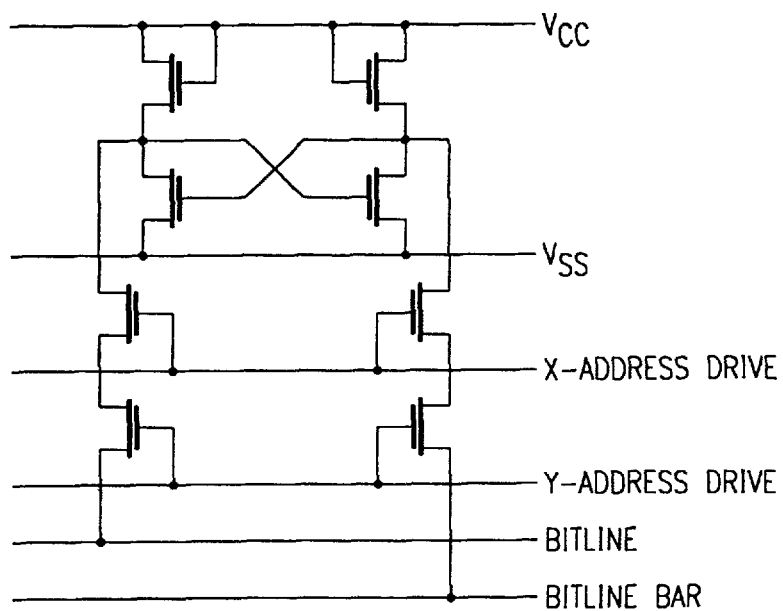
FIG. 1B illustrates a simplified schematic diagram of an eight transistor static random access memory cell.
Figure 2:
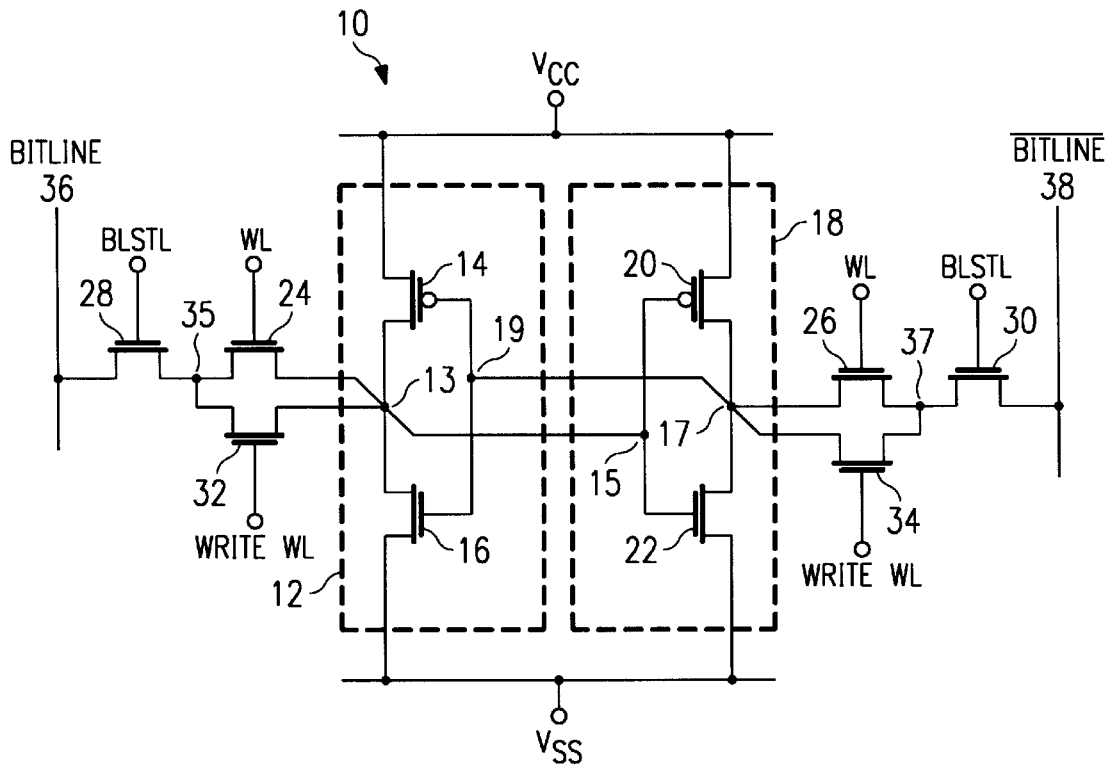
FIG. 2 illustrates a simplified schematic diagram of a low voltage, low power static random access memory cell.

FIG. 2 is a simplified schematic diagram of a ten transistor low voltage, low power SRAM memory cell 10. Low voltage, low power SRAM cell 10 includes a first inverter 12 having a first pull-up transistor 14 between a high end of the supply voltage node, Vcc, and a first inverter output node 13. First inverter 12 also has a first pull-down transistor 16 connected between output node 13 and a low end of the supply voltage node, Vss. The SRAM cell 10 also includes a second inverter 18 having a second pull-up transistor 20 and a second pull-down transistor 22. Second pull-up transistor 20 is connected between the Vcc and an output node 17 of second inverter 18. Second pull-down transistor is connected between output node 17 and the Vss. The two inverters are cross-coupled, i.e., output node 13 of first inverter 12 is connected to an input node 15 of second inverter 18 and output node 17 of the second inverter 18 is connected to an input node 19 of first inverter 12.

A first pass transistor 24 is connected between output node 13 of first inverter 12 and a first pass node 35. A first bitline select transistor 28 is placed between first pass node 35 and a first bitline (Bitline) 36. A first write pass transistor 32 is also connected between first pass node 35 and output node 13 of first inverter 12. The cell also includes a second pass transistor 26 connected between output node 17 of second inverter 18 and a second pass node 37. A second bitline select transistor 30 is placed between second pass node 37 and a second bitline (also called Bitline Bar) 38. A second write pass transistor 34 is also connected between second pass node 37 and output node 17 of second inverter 18.

In an SRAM array, the gates of pass transistors 24 and 26 are connected to a bus called Wordline (WL), the gates for write pass transistors 32 and 34 are connected to a bus called Write Wordline (Write WL), and the gates for bitline select transistors 28 and 30 are connected to a bus called Bitline Select Transistor Line (BLSTL). Typically, the signal for the Wordline and the Write Wordline are derived from the X-address, or row select, and the signal for the Bitline Select Transistor Line is derived from the Y-address, or column select. The Bitline Select Transistor Line runs perpendicular to the Wordline and the Write Wordline buses. That is, if the Wordline and Write Wordline buses are running in the X-direction, the Bitline Select Transistor Line will run in the Y-direction. The Bitline and Bitline Bar buses will also run in the Y-direction.

In the preferred embodiment, the pull-down transistors have n-channel configurations and have twice the width of the pass transistors which are also of n-channel configuration. The pull-up transistors have p-channel configurations and have widths around 1 to 1.5 times the width for the pass transistors. The width of the bitline select transistors which have n-channel configurations are about 4 times that of the pass transistors and the width of the write pass transistors which have n-channel configurations are 1.5 times that of the pass transistors. The transistors may also have different threshold voltages. A lower threshold voltage for the bitline select transistors compared to that for the pass transistors is expected to increase the read current of a cell and make it easier to write into the cell.

In the above embodiment shown in the FIG. 2, the order of the bitline select transistor and the parallel combination of the pass and write transistors placed between a bitline and an output node of an inverter can be reversed. The SRAM cell can have the first bitline select transistor 28 connected between the output node 13 of the first inverter 12 and the first pass node 35. The parallel combination of the first pass transistor 24 and the first write pass transistor 32 is connected between the first pass node 35 and the first bitline 36. The second bitline select transistor 30 is connected between the output node 17 of the second inverter 18 and the second pass node 37. The parallel combination of the second pass transistor 26 and the second write pass transistor 34 is connected between the second pass node 37 and the second bitline 38.

Figure 3:
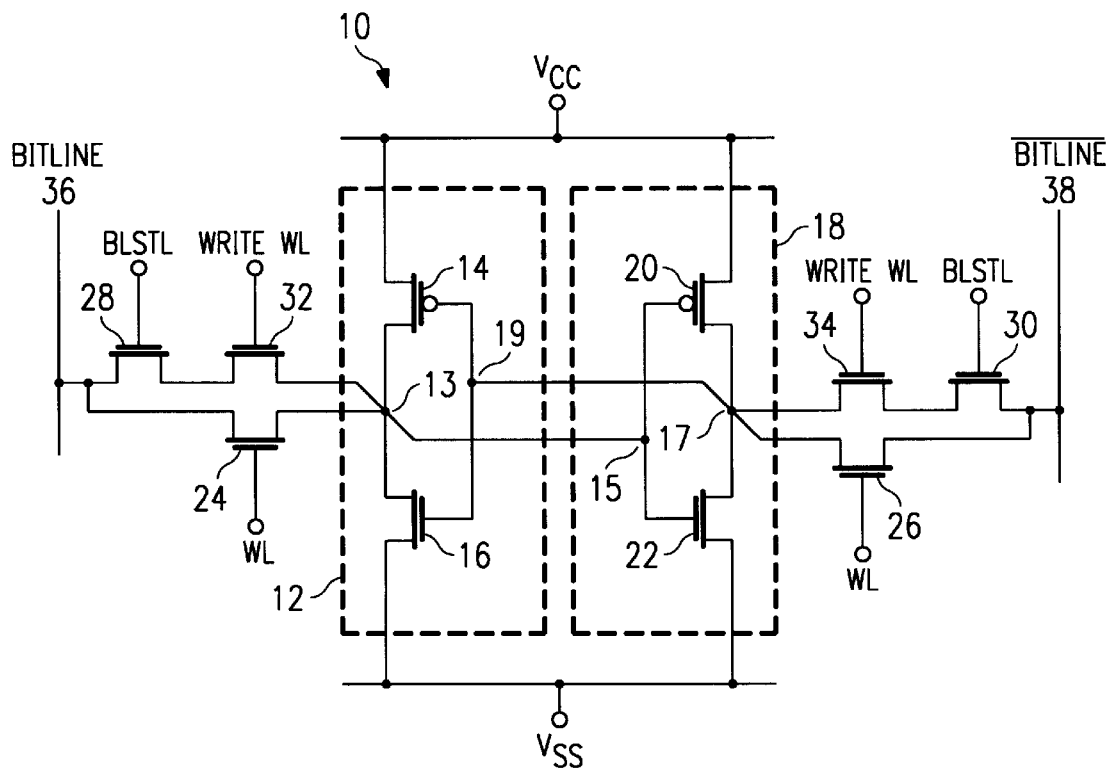
FIG. 3 illustrates a simplified schematic diagram of an alternate embodiment of the low voltage, low power static random access memory cell.

FIG. 3 is a simplified schematic diagram showing another embodiment of a low voltage, low power SRAM cell 10. The cell includes of a pair of cross-coupled inverters 12 and 18. In this embodiment, a first pass transistor 24 is connected directly between output node 13 of first inverter 12 and first bitline 36 and a second pass transistor 26 is connected directly between output node 17 of second inverter 18 and second bitline 38. A series combination of first write pass transistor 32 and first bitline select transistor 28 is also connected between output node 13 of first inverter 12 and first bitline 36. Also, a series combination of second write pass transistor 34 and second bitline select transistor 30 is placed between output node 17 of second inverter 18 and second bitline 38. In this embodiment, the read operation is performed by turning ON the pass transistors and the write operation is performed by turning ON the write pass transistors and bitline select transistors. Optionally, during the write operation the pass transistors could also be turned ON to make it easier to write.

Note that in a second embodiment, the order of the bitline select transistors and the write pass transistors can be reversed. SRAM cell 10 can have first write pass transistor 32 connected to first bitline 36 and first pass node 35, and first bitline select transistor 28 connected to first pass node 35 and output node 13 of first inverter 12. Similarly, second write pass transistor 34 can be connected to second bitline 38 and second pass node 37, with second bitline select transistor 30 connected to second pass node 37 and second output node 17 of the second inverter 18.

In the above embodiments, the pull-up and the pull-down transistors in the inverters have p-channel and n-channel configurations, respectively. However, a pull-up transistor could be replaced by a resistor as done in a four transistor, two resistor cell. The pull-up transistor can be built in a substrate along with the other transistors or it could be formed in a thin film polycrystalline silicon material (TFT). The substrate could be single crystalline bulk silicon, silicon on insulator, etc.

Thus, it is apparent that there has been provided, in accordance with the present invention, a low voltage, low power static random access memory cell that satisfies the advantages set forth above. Although the present invention has been described in detail, it should be understood that various changes, substitutions, and alterations can be made herein. For example, although direct connections are shown between transistors, these transistors may be coupled to each other by one or more intermediate components such as resistors, capacitors, and/or inductors while still providing a substantially similar operating capability. Other examples are readily ascertainable by one skilled in the art and can be made without departing from the spirit and scope of the present invention as defined by the following claims.

What is claimed is:

1. An SRAM cell comprising:
    first and second cross-coupled inverters, the first inverter including a first output node of the first inverter and the second inverter including a second output node of the second inverter;
    a first pass transistor connected between the output node of the first inverter and a first pass node;
    a first bitline select transistor connected between the first pass node and a first bitline;
    a first write pass transistor connected between the output node of the first inverter and the first pass node;
    a second pass transistor connected between the output node of the second inverter and a second pass node;
    a second bitline select transistor connected between the second pass node and a second bitline; and
    a second write pass transistor connected between the output node of the second inverter and the second pass node.

2. The SRAM cell of claim 1, wherein said first inverter includes a first pull-up transistor and a first pull-down transistor and the said second inverter includes a second pull-up transistor and a second pull-down transistor.

3. The SRAM cell of claim 1, wherein said first inverter includes a p-channel first pull-up transistor and an n-channel first pull-down transistor and the said second inverter includes a p-channel second pull-up transistor and an n-channel second pull-down transistor.

4. The SRAM cell of claim 1, wherein said first and second pass transistors, first and second bitline select transistors, and first and second write pass transistors are N-channels.

5. The SRAM cell of claim 1, wherein the first write pass transistor has 0.5 times or larger width than the first pass transistor and the second write pass transistor has 0.5 times or larger width than the second pass transistor.

6. The SRAM cell of claim 1, wherein the cell is used for low voltage or low power applications having a supply voltage level of 1.5 volts or less.

7. The SRAM cell of claim 1, wherein the first and second pass transistors have p-channel configurations.

8. The SRAM cell of claim 1, wherein the first and second write pass transistors have p-channel configurations.

9. The SRAM cell of claim 1, wherein the first and second bitline select transistors have p-channel configurations.

10. An SRAM cell comprising:
    first and second cross-coupled inverters, the first inverter including a first output node of the first inverter and the second inverter including a second output node of the second inverter;
    a first pass transistor connected between the output node of the first inverter and a first bitline;
    a first bitline select transistor connected between the first bitline and a first pass node;
    a first write pass transistor connected between the output node of the first inverter and the first pass node;
    a second pass transistor connected between the output node of the second inverter and a second bitline;
    a second bitline select transistor connected between the second bitline and a second pass node; and
    a second write pass transistor connected between the output node of the second inverter and the second pass node.

11. The SRAM cell of claim 10, wherein said first inverter includes a first pull-up transistor and a first pull-down transistor and the said second inverter includes a second pull-up transistor and a second pull-down transistor.

12. The SRAM cell of claim 10, wherein said first inverter includes a p-channel first pull-up transistor and an n-channel first pull-down transistor and the said second inverter includes a p-channel second pull-up transistor and an n-channel second pull-down transistor.

13. The SRAM cell of claim 10, wherein said first and second pass transistors, first and second bitline select transistors, and first and second write pass transistors have n-channel configurations.

14. The SRAM cell of claim 10, wherein the first write pass transistor and the first bitline select transistor have larger widths than the first pass transistor and the second write pass transistor and the second bitline select transistor have larger widths than the second pass transistor.

15. The SRAM cell of claim 10, wherein the cell is used for low voltage or low power applications having a supply voltage level of 1.5 Volts or less.

16. The SRAM cell of claim 10, wherein the first and second pass transistors have p-channel configurations.

17. The SRAM cell of claim 10, wherein the first and second write pass transistors have p-channel configurations.

18. The SRAM cell of claim 10, wherein the first and second bitline select transistors have p-channel configurations.

19. An SRAM cell comprising:
    first and second cross-coupled inverters, the first inverter including a first output node of the first inverter and the second inverter including a second output node of the second inverter;
    a first bitline select transistor connected between the output node of the first inverter and a first pass node;
    a first pass transistor connected between the first pass node and a first bitline;
    a first write pass transistor connected between the first bitline and the first pass node;
    a second bitline select transistor connected between the output node of the second inverter and a second pass node;
    a second pass transistor connected between the second pass node and a second bitline; and a second write pass transistor connected between the second bitline and the second pass node.

20. The SRAM cell of claim 19, wherein said first inverter includes a first pull-up transistor and a first pull-down transistor and the said second inverter includes a second pull-up transistor and a second pull-down transistor.

21. The SRAM cell of claim 19, wherein said first inverter includes a p-channel first pull-up transistor and an n-channel first pull-down transistor and the said second inverter includes a p-channel second pull-up transistor and an n-channel second pull-down transistor.

22. The SRAM cell of claim 19, wherein said first and second pass transistors, first and second bitline select transistors, and first and second write pass transistors are N-channels.

23. The SRAM cell of claim 19, wherein the first write pass transistor has 0.5 times or larger width than the first pass transistor and the second write pass transistor has 0.5 times or larger width than the second pass transistor.

24. The SRAM cell of claim 19, wherein the cell is used for low voltage or low power applications having a supply voltage level of 1.5 volts or less.

25. The SRAM cell of claim 19, wherein the first and second pass transistors have p-channel configurations.

26. The SRAM cell of claim 19, wherein the first and second write pass transistors have p-channel configurations.

27. The SRAM cell of claim 19, wherein the first and second bitline select transistors have p-channel configurations.

* * * * *